(12) United States Patent
Bi et al.

(10) Patent No.: US 10,586,737 B2
(45) Date of Patent: Mar. 10, 2020

(54) METHOD AND STRUCTURE FOR FORMING VERTICAL TRANSISTORS WITH SHARED GATES AND SEPARATE GATES

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/921,930

(22) Filed: Mar. 15, 2018

(65) Prior Publication Data

US 2018/0301381 A1 Oct. 18, 2018

Related U.S. Application Data

(62) Division of application No. 15/485,915, filed on Apr. 12, 2017, now Pat. No. 10,002,795.

(51) Int. Cl.
| | | |
|---|---|---|
| H01L 21/8234 | (2006.01) | |
| H01L 27/088 | (2006.01) | |
| H01L 29/78 | (2006.01) | |
| H01L 29/66 | (2006.01) | |
| H01L 27/12 | (2006.01) | |
| H01L 21/84 | (2006.01) | |
| H01L 29/423 | (2006.01) | |
| H01L 29/786 | (2006.01) | |

(52) U.S. Cl.
CPC ......... *H01L 21/823487* (2013.01); *H01L 21/823437* (2013.01); *H01L 21/84* (2013.01); *H01L 27/088* (2013.01); *H01L 27/1203* (2013.01); *H01L 29/42392* (2013.01); *H01L 29/66666* (2013.01); *H01L 29/7827* (2013.01); *H01L 29/78642* (2013.01)

(58) Field of Classification Search
CPC ....... H01L 21/823487; H01L 29/66666; H01L 29/7827; H01L 27/088; H01L 21/84; H01L 29/42392; H01L 29/78642; H01L 27/1203; H01L 21/823437
See application file for complete search history.

(56) References Cited

U.S. PATENT DOCUMENTS

| | | | |
|---|---|---|---|
| 6,660,590 B2 | 12/2003 | Yoo | |
| 6,818,937 B2 | 11/2004 | Noble et al. | |
| 6,846,709 B1 | 1/2005 | Lojek | |
| 7,033,877 B2 | 4/2006 | Chaudhry et al. | |

(Continued)

OTHER PUBLICATIONS

List of IBM Patents or Patent Applications Treated as Related.

*Primary Examiner* — Yasser A Abdelaziez
(74) *Attorney, Agent, or Firm* — Vazken Alexanian; Ryan, Mason & Lewis, LLP (57) ABSTRACT

A method for manufacturing a semiconductor device includes forming a fin on a substrate, removing one or more portions of the fin prior to forming a gate structure on the fin, forming the gate structure on the fin, and simultaneously removing one or more additional portions of the fin and one or more portions of the gate structure aligned with the one or more additional portions of the fin to create a fin edge portion aligned with a gate structure edge portion.

9 Claims, 9 Drawing Sheets

(56) References Cited

U.S. PATENT DOCUMENTS

| | | | |
|---|---|---|---|
| 8,362,561 B2 | 1/2013 | Nuttinck et al. | |
| 9,224,837 B2 | 12/2015 | Anderson et al. | |
| 9,245,885 B1 | 1/2016 | Xie et al. | |
| 9,281,044 B2 | 3/2016 | Ramaswamy et al. | |
| 9,312,383 B1 * | 4/2016 | Cheng | H01L 29/7827 |
| 9,343,507 B2 | 5/2016 | Takaki | |
| 9,400,862 B2 | 7/2016 | Kawa et al. | |
| 2009/0294800 A1 * | 12/2009 | Cheng | H01L 21/823412 |
| | | | 257/192 |
| 2013/0267073 A1 | 10/2013 | Yin et al. | |
| 2015/0041897 A1 * | 2/2015 | Basker | H01L 29/7848 |
| | | | 257/347 |
| 2017/0125579 A1 | 5/2017 | Lin | |
| 2017/0243790 A1 | 8/2017 | Xie et al. | |
| 2017/0352625 A1 * | 12/2017 | Leobandung | H01L 23/535 |
| 2017/0358660 A1 * | 12/2017 | Cheng | H01L 29/66666 |

\* cited by examiner

FIG. 1C
A-A AND B-B XSECTION (SAME)

FIG. 1D
C-C FIN XSECTION

FIG. 1A
SHARED GATE

FIG. 1B
SEPARATE GATES

FIG. 2A
SHARED GATE

FIG. 2B
SEPARATE GATES

FIG. 2C
A-A XSECTION

FIG. 2D
B-B XSECTION

FIG. 5A SHARED GATE

FIG. 5B SEPARATE GATES

FIG. 5C A-A XSECTION

FIG. 5D B-B XSECTION

*FIG. 9A*
SHARED GATE

*FIG. 9B*
SEPARATE GATES

US 10,586,737 B2

METHOD AND STRUCTURE FOR FORMING VERTICAL TRANSISTORS WITH SHARED GATES AND SEPARATE GATES

TECHNICAL FIELD

The field generally relates to semiconductor devices and methods of manufacturing same and, in particular, to forming vertical transistors in shared and separate gate configurations.

BACKGROUND

Vertical field effect transistors (VFETs) are becoming viable device options for complementary metal oxide semiconductor (CMOS) devices beyond 7 nm node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

A typical semiconductor chip has a variety of circuits. Some circuits may include transistors that share a gate, where, for example, two adjacent VFETs have different fin channels but share the same gate. The shared gate may be physically connected at a gate level so that only a single gate contact is needed for both transistors. Other circuits may have separate gates, meaning two gates electrically isolated from each other, one gate for each respective transistor. A minimal distance between two adjacent gates is required to accommodate inherent process variations, but adversely impacts device density.

SUMMARY

According to an exemplary embodiment of the present invention, a method for manufacturing a semiconductor device includes forming a plurality of fins on a substrate, cutting the plurality of fins in one or more areas prior to forming a gate structure on each of the plurality of fins, forming the gate structure on each of the plurality of fins, and simultaneously cutting the plurality of fins and the gate structure on each of the plurality of fins in one or more areas to create a fin edge portion aligned with a gate structure edge portion in the one or more areas.

According to an exemplary embodiment of the present invention, a semiconductor device includes at least two vertical transistors positioned adjacent each other on a substrate, wherein the at least two vertical transistors each include a fin, and a gate structure formed around the fin. A first edge of a first vertical transistor of the at least two vertical transistors is positioned opposite a second edge of a second vertical transistor of the at least two vertical transistors, and the fin and gate structure of each of the at least two vertical transistors are aligned in the vertical direction with respect to the substrate at the first and second edges.

According to an exemplary embodiment of the present invention, a method for manufacturing a semiconductor device includes forming a fin on a substrate, removing one or more portions of the fin prior to forming a gate structure on the fin, forming the gate structure on the fin, and simultaneously removing one or more additional portions of the fin and one or more portions of the gate structure aligned with the one or more additional portions of the fin to create a fin edge portion aligned with a gate structure edge portion.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to formation of aligned fin and gate edges to permit high density formation of multiple transistors on a chip without shorting.

It is to be understood that the various layers and/or regions shown in the accompanying drawings are not drawn to scale, and that one or more layers and/or regions of a type commonly used in, for example, a complementary metal-oxide semiconductor (CMOS), nanowire field-effect transistor (FET), fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, nanowire FETs, nanosheet FETs, vertical FETs, SETs, CMOSs, MOSFETs and/or FinFETs. By way of non-limiting example, the semiconductor devices can include, but are not limited to nanowire FET, nanosheet FET, vertical FET, SET, CMOS, MOSFET and FinFET devices, and/or semiconductor devices that use CMOS, MOSFET, nanowire FET, nanosheet FET, vertical FET, SET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "cut" or "cutting" refers to removal of a portion of a material referred to as being cut. For example, cutting of a fin and/or a gate structure refers to removal of a portion of the fin and/or gate structure, by, for example, a removal process, such as, but not necessarily limited to, etching.

The conflicting requirements of requiring a minimal distance between two adjacent gates to accommodate inherent process variations, while also attempting to increase device density, has created a need for improved VFET designs and processing. Unlike conventional horizontal FETs, in VFETs, each fin should be completely gated to prevent vertical source-to-drain leakage current. Ungated fin portions cause vertical source-to-drain leakage current in VFETs. An ungated fin portion could be due to misalignment between a gate mask and fin edge, causing the gate mask to be offset with respect to the fin edge. A gate which extends beyond a fin edge to ensure the control of the entire fin channel by the gate results in desired electrical characteristics, but compromises device density.

Embodiments of the present invention provide a method and structure for forming VFETs with a variety of circuit configurations (e.g., shared gate, separate gates) using a hybrid fin cut integrated with gate cutting. A shared gate configuration includes two VFETs with a common gate, and a configuration with separate gates includes two VFETs, each with a separate gate electrically isolated from the gate of the other transistor. In general, for the shared gate configuration, fins are cut before gate formation. Then after gate deposition/patterning, a shared gate is formed at adjacent ends of two adjacent VFETs. For VFETs with separate gates, fins and gates are cut at the same time to ensure the fin ends and gate ends are perfectly aligned to prevent ungated fin portions, and save area. For example, self-aligned fin/gate edges are formed, allowing two adjacent FETs to be closely placed with respect to each other, without shorting each other.

Figure 1A:
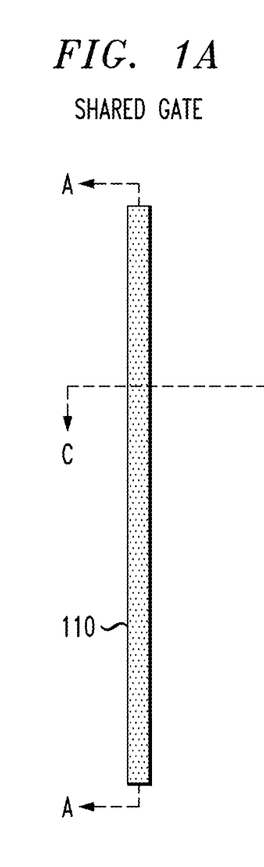
FIGS. 1A-1B are top-down views and FIGS. 1C-1D are cross-sectional views of fin formation in a method of manufacturing a semiconductor device, according to an exemplary embodiment of the present invention.
Figure 1B:
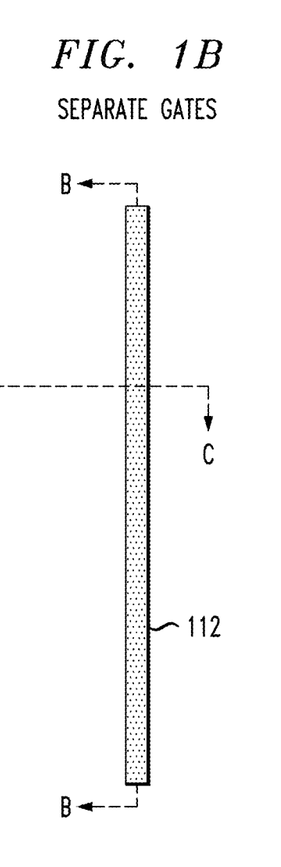
Figures 1C, 1D:
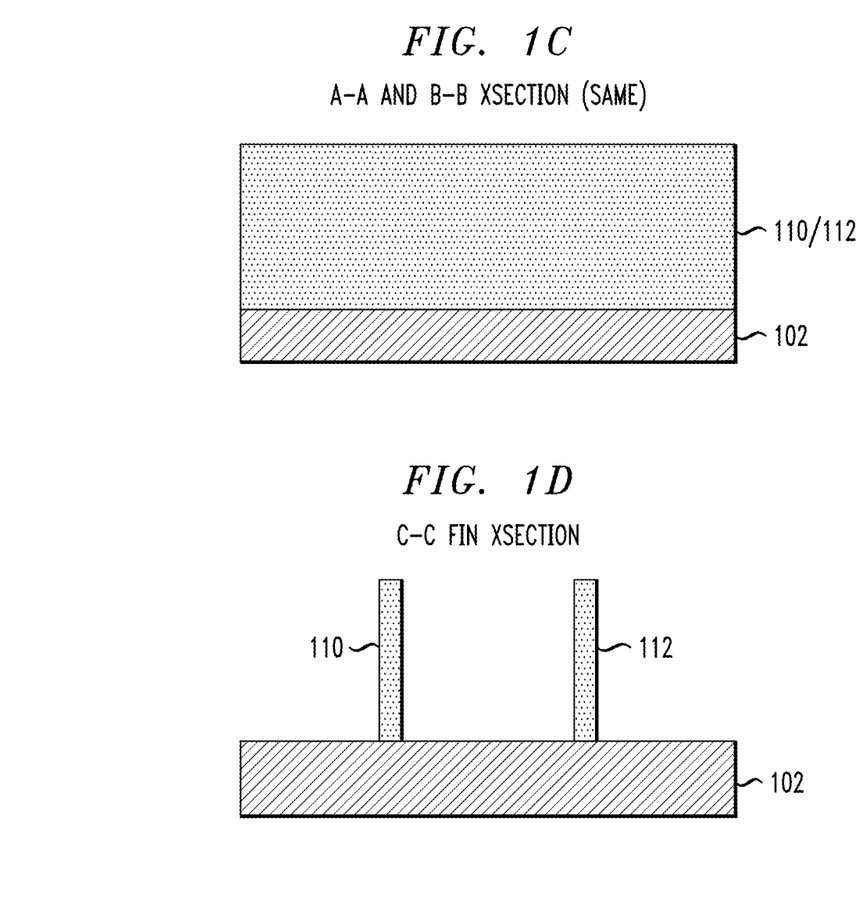

FIGS. 1A-1B are top-down views and FIGS. 1C-1D are cross-sectional views of fin formation in a method of manufacturing a semiconductor device, according to an exemplary embodiment of the present invention. Referring to FIGS. 1C and 1D, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 102 can be a bulk substrate or a silicon-on-insulator (SOI) substrate including a buried insulating layer, such as, for example, a buried oxide or nitride layer. In some embodiments, the substrate can comprise a doped layer, which can serve as the bottom source/drain of later formed VFETs. Alternatively, the bottom source/drain can be formed in later processes.

Fins, such as fins 110 and 112, can be formed by patterning a semiconductor layer into the fins 110, 112. The semiconductor layer can include, but is not necessarily limited to, Si, SiGe or III-V materials, and may be epitaxially grown. According to an embodiment, a hard mask including, for example, a dielectric material, such as silicon nitride (SiN) is formed on portions of the semiconductor layer that are to be formed into the fins 110, 112. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. While embodiments of the present invention describe channel regions as fins, the embodiments are not necessarily limited to fin channel regions, and may include nanowire channel regions. In addition, although two fins 110, 112 are shown in the figures for ease of explanation, more than two fins can be formed.

Figure 2A:
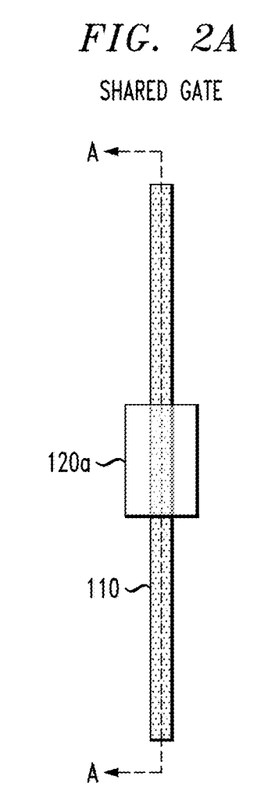
FIGS. 2A-2B are top-down views and FIGS. 2C-2D are cross-sectional views of fin cutting in a method of manufacturing a semiconductor device, according to an exemplary embodiment of the present invention.
Figure 2B:
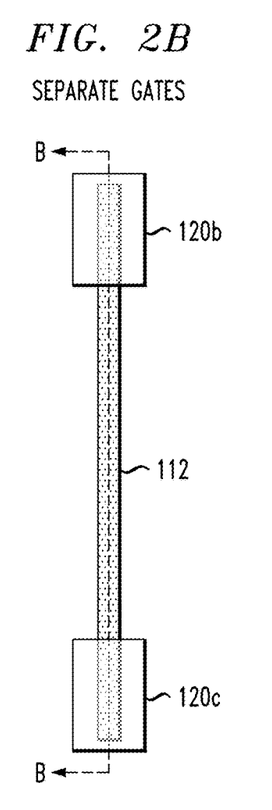
Figure 2C:
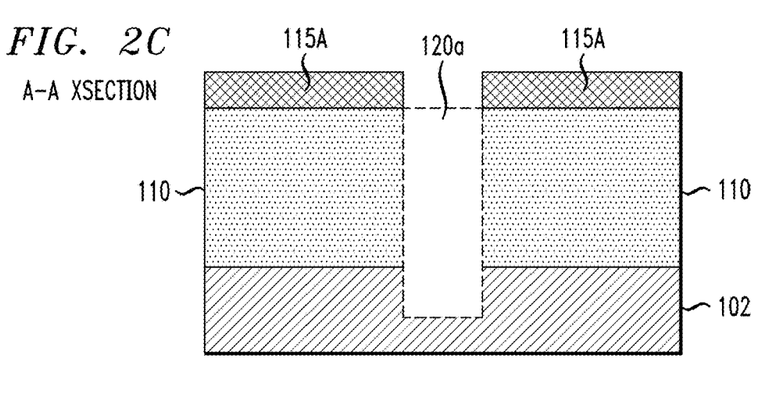
Figure 2D:
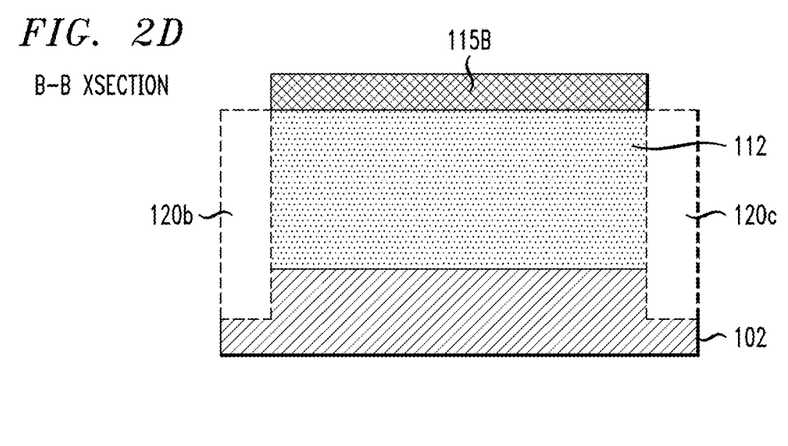

FIGS. 2A-2B are top-down views and FIGS. 2C-2D are cross-sectional views of fin cutting in a method of manufacturing a semiconductor device, according to an exemplary embodiment of the present invention. Referring to FIGS. 2A and 2C, a first fin 110 is cut at a middle portion, to divide fin 110 into two portions. A cut portion 120a is illustrated between the two portions of fin 110 to show where portions of the fin 110 and the substrate 102 are removed. The two remaining portions of the fin 110 are covered by masks 115A, which block the two portions from being removed during a removal process. Referring to FIGS. 2B and 2D, a second fin 112 is cut at ends, as shown by cut portions 120b and 120c, where end portions of the fin 112 and portions of the substrate 102 are removed. The remaining portion of the fin 112 is covered by a mask 115B, which block the remaining portion from being removed during a removal process. The masks 115A and 115B can include for example, hard masks, such as silicon nitride (SiN) or soft masks, such as resists or organic planarization layers (OPLs). The removal process for removing portions of the fins 110 and 112 can include directional etching, such as a reactive ion etch (ME). As described in more detail herein, the portions of the fins 110 and 112 that are removed correspond to locations where gate contacts are to be formed.

Figure 3A:
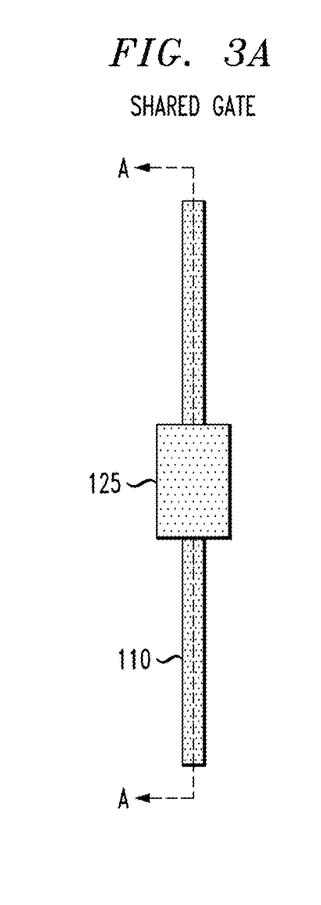
FIGS. 3A-3B are top-down views and FIGS. 3C-3D are cross-sectional views of formation of isolation regions in a method of manufacturing a semiconductor device, according to an exemplary embodiment of the present invention.
Figure 3B:
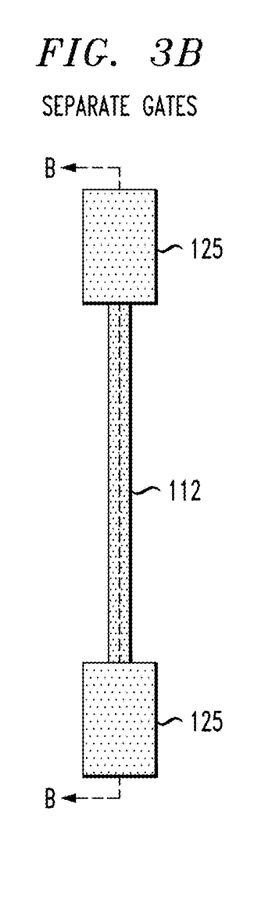
Figure 3C:
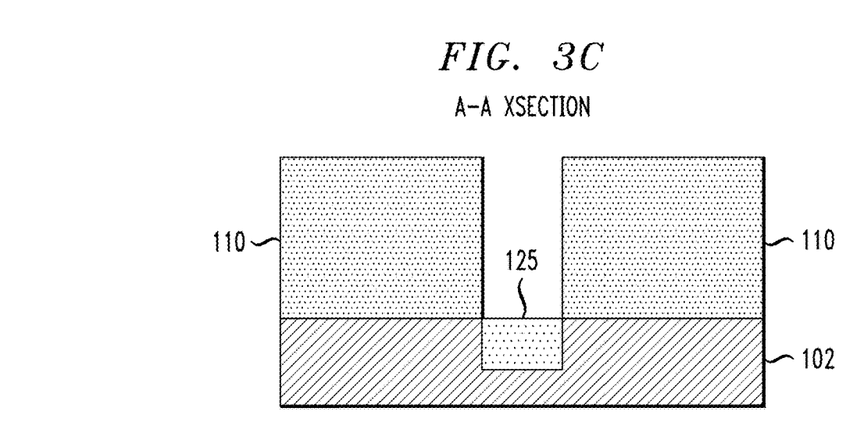
Figure 3D:
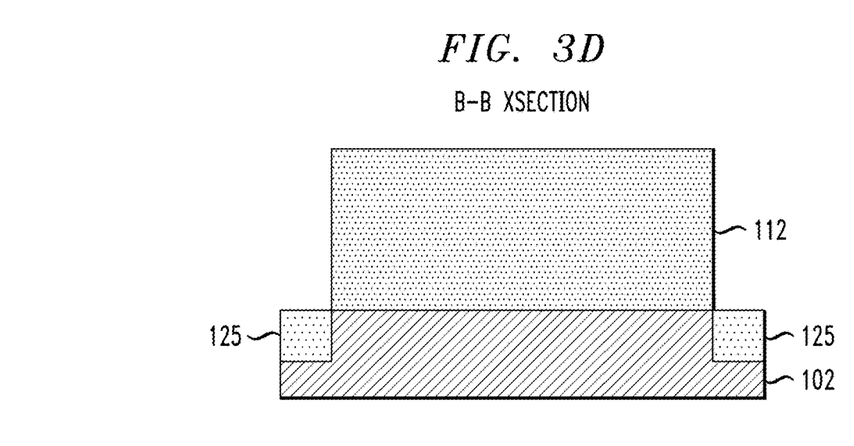

FIGS. 3A-3B are top-down views and FIGS. 3C-3D are cross-sectional views of formation of isolation regions in a method of manufacturing a semiconductor device, according to an exemplary embodiment of the present invention. Referring to FIGS. 3A-3D, isolation regions 125 such as, for example, shallow trench isolation (STI) regions, are formed by depositing a dielectric material, including, but not necessarily limited to silicon dioxide ($SiO_2$), low-temperature oxide (LTO), high-temperature oxide (HTO), flowable oxide (FOX) or some other dielectric, where portions of the substrate 102 were removed during the fin cutting process described in connection with FIGS. 2A-2D. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process, such as, chemical mechanical planarization (CMP) to remove excess isolation material.

Figure 4A:
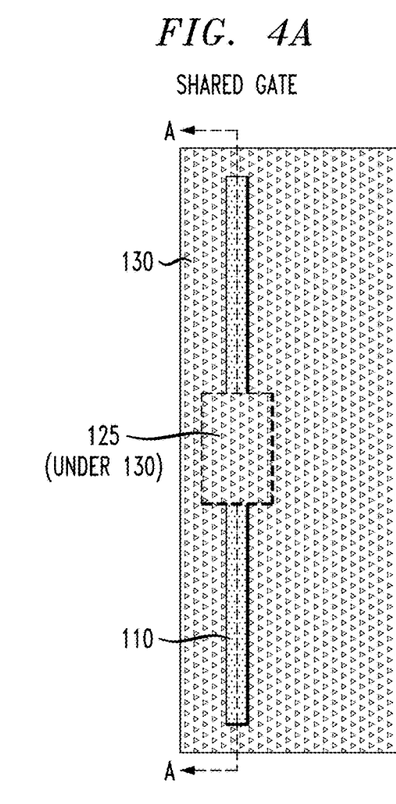
FIGS. 4A-4B are top-down views and FIGS. 4C-4D are cross-sectional views of bottom source/drain and gate formation in a method of manufacturing a semiconductor device, according to an exemplary embodiment of the present invention.
Figure 4B:
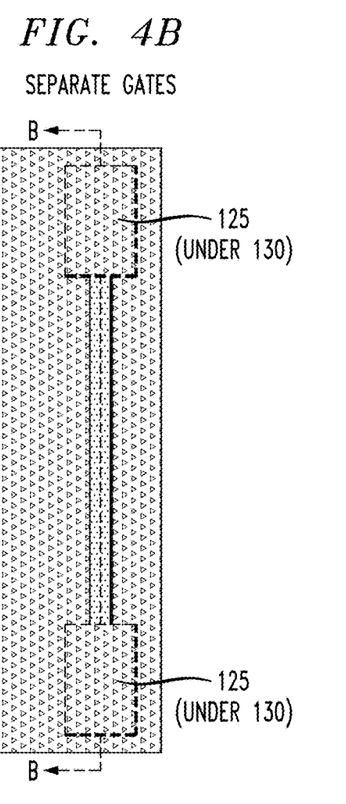
Figure 4C:
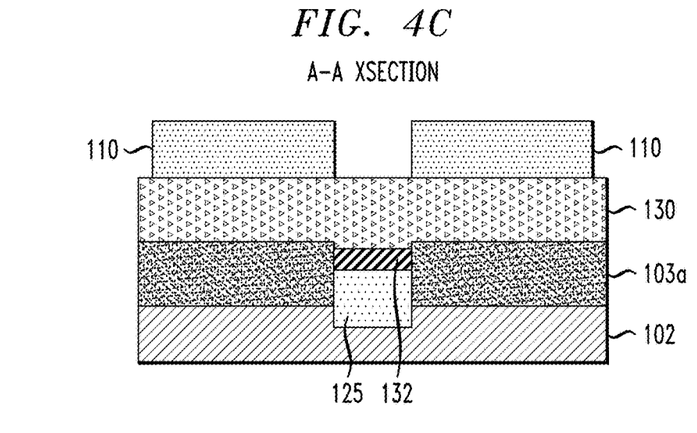
Figure 4D:
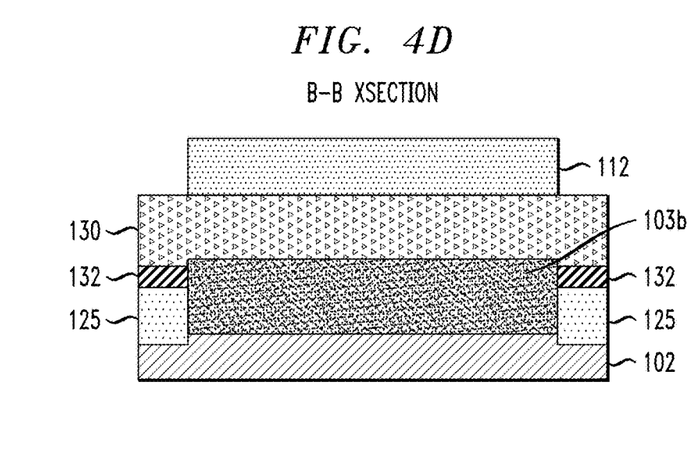

FIGS. 4A-4B are top-down views and FIGS. 4C-4D are cross-sectional views of bottom source/drain and gate formation in a method of manufacturing a semiconductor device, according to an exemplary embodiment of the present invention. Referring to FIGS. 4C-4D, bottom source/drain regions 103a and 103b are formed corresponding to each fin 110 and 112. The bottom source/drain regions 103a and 103b can be formed by doping bottom portions of the fins 110, 112 adjacent the substrate 102. Doping can be performed using processes, such as, for example, ion implantation, in situ, gas phase doping, plasma doping, plasma immersion ion implantation, cluster doping, infusion doping, liquid phase doping, solid phase doping, epitaxy, in-situ doped epitaxy, etc., and dopants may include, for example, an n-type dopant selected from a group of phosphorus (P), arsenic (As) and antimony (Sb), and a p-type dopant selected from a group of boron (B), boron fluoride ($BF_2$), gallium (Ga), indium (In), and thallium (Tl) at various concentrations. For example, in a non-limiting example, a dopant concentration range may be $1e18/cm^3$ to $1e21/cm^3$. Bottom spacers 132 are formed on isolation regions 125 under a gate structure 130 and around the bottom source/drain regions 103a and 103b to isolate the gate from the bottom source/drain regions 103a and 103b. Bottom spacers 132 include, but are not necessarily limited to, PECVD-type, high aspect ratio process (HARP)-type or high density plasma (HDP)-type low-K dielectric layers, including, but not limited to, SiBCN, SiOCN, SiOC, SiN or $SiO_2$, deposited using, for example, PECVD, HARP or HDP techniques, on the isolation regions 125.

A gate structure 130 is deposited on the spacer layers 132, and on and around the fins 110, 112, using, for example, deposition techniques including, but not limited to, CVD, PECVD, RFCVD, PVD, ALD, MLD, MBD, PLD, LSMCD, sputtering, and/or plating. The gate structure 130 can include, for example, a high-K dielectric layer including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide), and a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate structure includes a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. A planarization process, such as, for example, CMP, is performed to remove excess portions of the gate structure 130 on the fins 110, 112, and portions of the gate structure 130 below an upper surface of the fins 110, 112 are removed using, for example, for example, an anisotropic etch process, such as RIE, ion beam etching, plasma etching or laser ablation. As can be seen, the gate structure 130 is recessed to a height below an upper surface of the fins 110, 112.

Figure 5A:
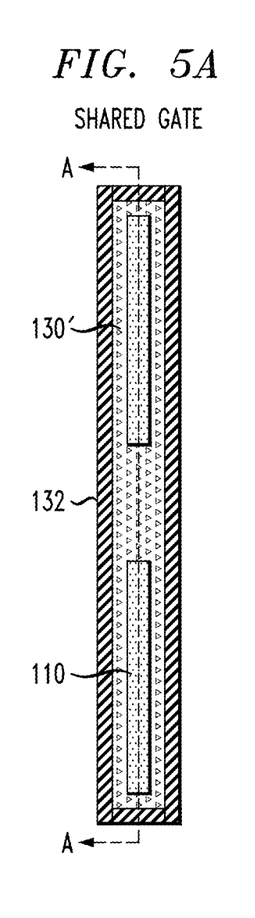
FIGS. 5A-5B are top-down views and FIGS. 5C-5D are cross-sectional views of gate patterning in a method of manufacturing a semiconductor device, according to an exemplary embodiment of the present invention.
Figure 5B:
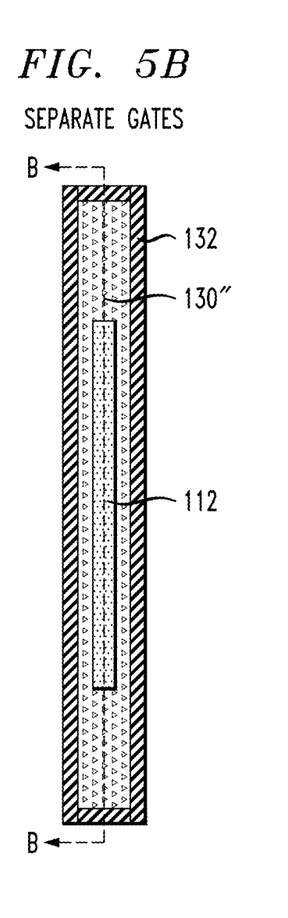
Figure 5C:
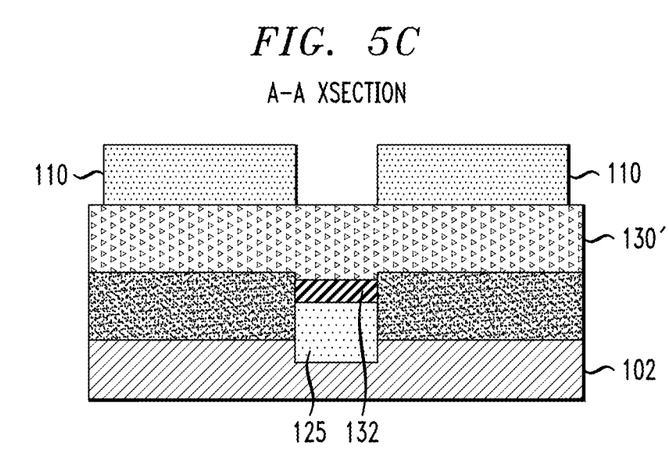
Figure 5D:
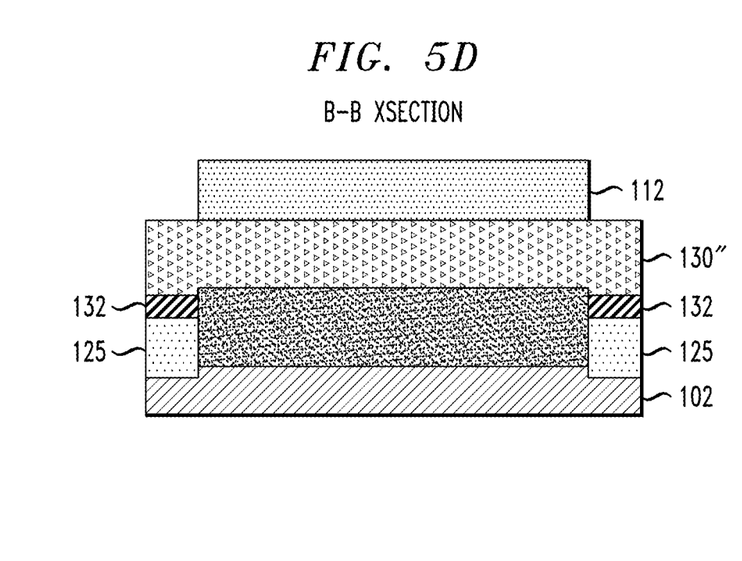

FIGS. 5A-5B are top-down views and FIGS. 5C-5D are cross-sectional views of gate patterning in a method of manufacturing a semiconductor device, according to an exemplary embodiment of the present invention. As shown in the top-down views in FIGS. 5A-5B, the gate structure 130 is patterned into separate portions 130' and 130" corresponding to each fin 110 and 112, referred to herein as stripes, using, for example, a masking and directional etching process. Unmasked portions of the gate structure 130 are removed using, for example, ME, or other directional etching technique. Patterning of the gate structure exposes the bottom spacers 132 formed under the gate structure 130.

Figure 6A:
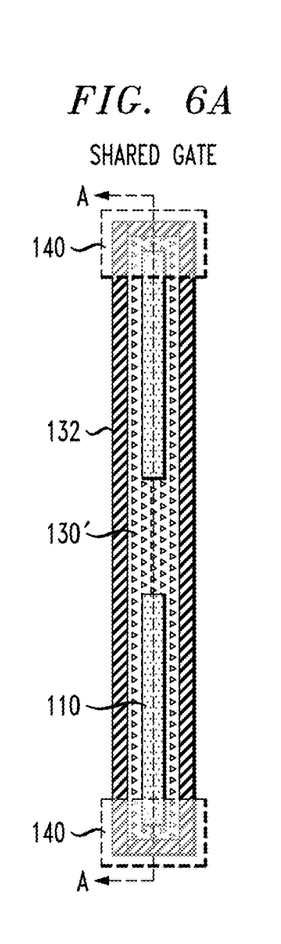
FIGS. 6A-6B are top-down views and FIGS. 6C-6D are cross-sectional views of simultaneous gate and fin cutting in a method of manufacturing a semiconductor device, according to an exemplary embodiment of the present invention.
Figure 6B:
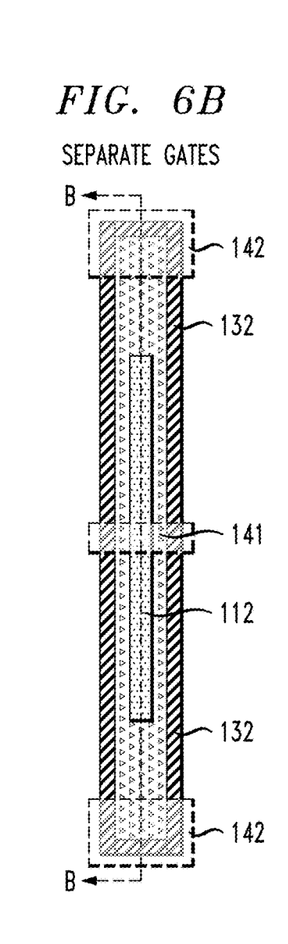
Figure 6C:
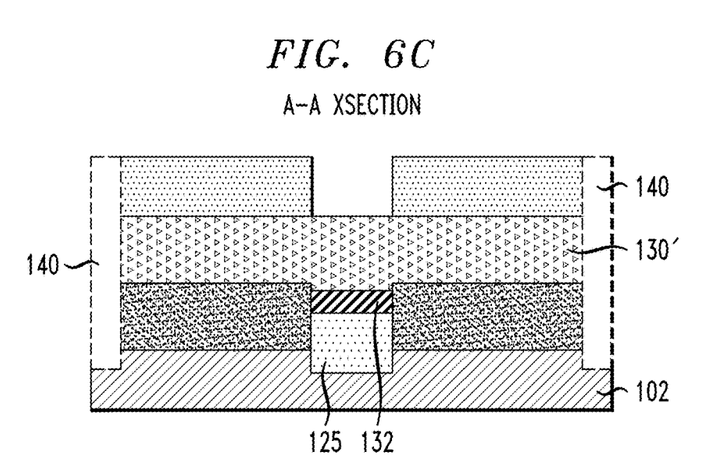
Figure 6D:
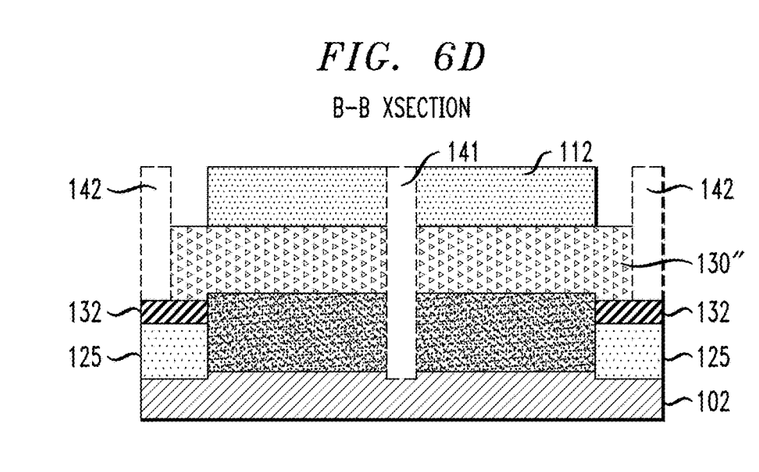

FIGS. 6A-6B are top-down views and FIGS. 6C-6D are cross-sectional views of simultaneous gate and fin cutting in a method of manufacturing a semiconductor device, according to an exemplary embodiment of the present invention. Referring to FIGS. 6A and 6C, in order to ensure alignment between gate and fin portions at cut end portions, the gate stripes 130' and the fins 110 are simultaneously cut at portions 140. In addition, the bottom source/drain region 103a is also simultaneously cut at portions 140. Similarly, referring to FIGS. 6B and 6D, in order to ensure alignment between gate and fin portions at cut end portions, the gate stripes 130" and the fins 112 are simultaneously cut at portion 141. In addition, the bottom source/drain region 103b is also simultaneously cut at portion 141. As a result of the simultaneous removal of gate and fin portions in the areas 140 and 141, the ends of the gate stripe 130' are perfectly aligned with ends of portions of the fin 110 (and bottom source/drain region 103a) at areas 140, and the ends of portions of the gate stripe 130" are perfectly aligned with ends of portions of the fin 112 (and bottom source/drain region 103b) at area 141. As can be seen, the alignment between the gate and fin is in the vertical direction with respect to a top surface of the substrate 102. According to an embodiment, a width of the area 141 (i.e., a distance between resulting adjacent vertical transistors) is in the range of about 10 nm to about 80 nm.

In addition, referring to FIGS. 6B and 6D, end portions of the gate stripe 130" are removed at areas 142 where top spacer and inter-level dielectric layers are to be formed. The removal process for removing the portions of the fins 110 and 112 and gate stripes 130', 130" can include directional etching, such as a reactive ion etch (ME), where the portions of the fins 110, 112 and gate stripes 130', 130" to remain are covered by masks which block the remaining portions from being removed during a removal process. The masks can include for example, hard masks, such as silicon nitride (SiN) or soft masks, such as resists or organic planarization layers (OPLs).

In accordance with an embodiment of the present invention, metal gate portions can be etched, for example, using a dry etch (e.g., RIE) or wet etch process. If the metal gate comprises tungsten, for example, it can be etched by using fluorine-based chemistry. High-k gate dielectrics can be etched by dry or wet etch processes. In one example, dielectrics can be etched by a wet etch containing hydrofluoric acid. Fins can be etched by dry or wet etch processes. For example, silicon fins can be etched by a dry etch containing $SF_6$, or wet etch containing ammonia. In some embodiments, all the fin and gate portions can be etched by a non-selective etch process, such as reactive ion etch, provided the mask layer is thicker than the thickness of the materials being removed. According to an embodiment, the removal of the portions at all areas 140, 141 and 142 can occur during the same removal process. Upper portions of the substrate 102 may optionally be removed during the etching of the gate stripe and fin portions.

At the ends where the gate and fin portions are aligned due to the simultaneous cuts, since excess gate portions are not protruding from these ends of the devices, adjacent devices (e.g., two VFETs) can be densely positioned next to each other on a chip without shorting due to contact between gates. In addition, ungated fin portions due to misalignment between gate and fin edges can be prevented. As a result, vertical source-to-drain leakage current in VFETs is prevented. At the ends where the gates extend, for example, at portions 142, or between previously separated fins as in FIGS. 6A and 6C, the extended gate portions can be shared gates between two transistors.

Figure 7A:
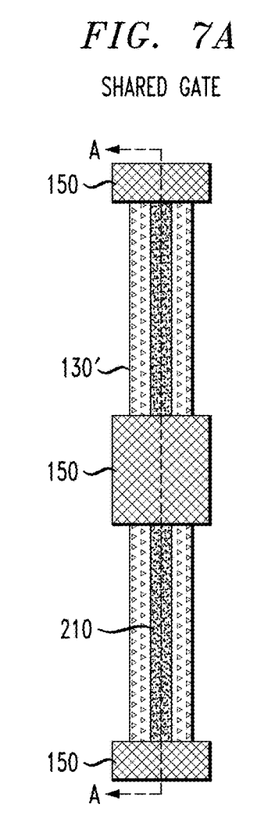
FIGS. 7A-7B are top-down views and FIGS. 7C-7D are cross-sectional views of inter-level dielectric deposition and top source/drain formation in a method of manufacturing a semiconductor device, according to an exemplary embodiment of the present invention.
Figure 7B:
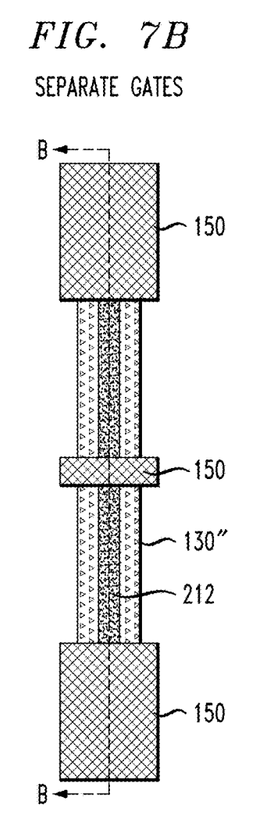
Figure 7C:
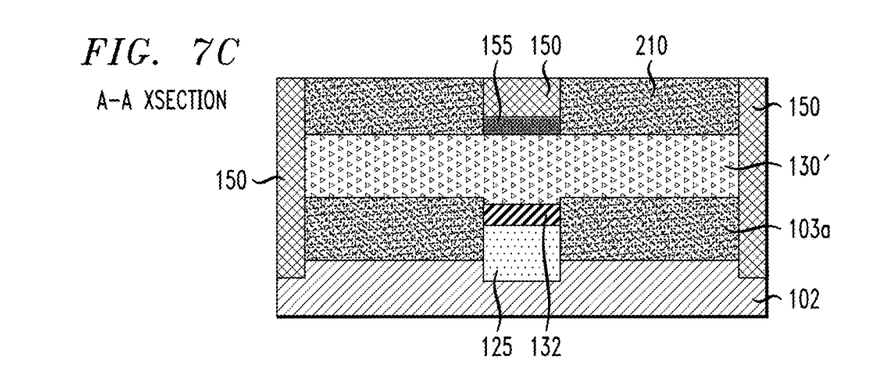
Figure 7D:
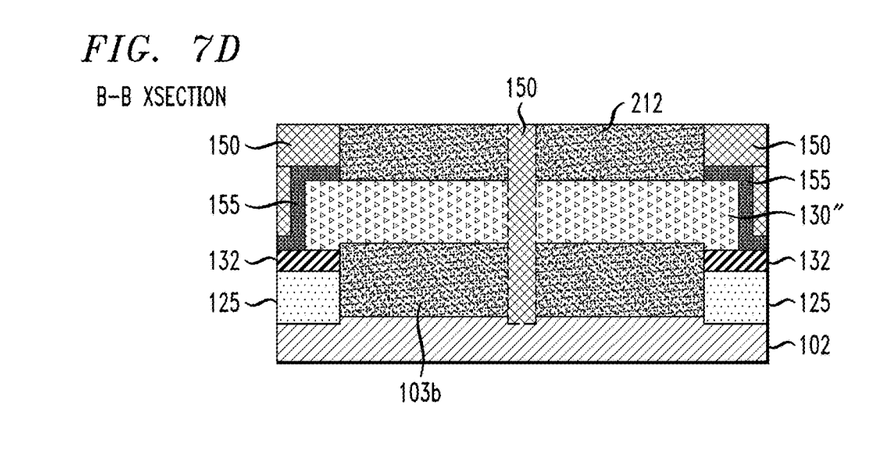

FIGS. 7A-7B are top-down views and FIGS. 7C-7D are cross-sectional views of inter-level dielectric deposition and top source/drain formation in a method of manufacturing a semiconductor device, according to an exemplary embodiment of the present invention. Referring to FIGS. 7A-7D, top source/drain regions 210, 212 are formed corresponding to each fin 110 and 112. The top source/drain regions 210, 212 can be formed by doping top portions of the fins 110, 112 adjacent the gate structures 130' and 130" and the channel region of the fins 110, 112 around which the gate structures 130' and 130" are formed. In some embodiments, the top source/drain is formed by in-situ doped epitaxy to enlarge the size of the top source/drain to reduce resistance. As a result, the fins 110, 112 comprise a bottom source/drain region 103a, 103b, a top source/drain region 210, 212, and a channel region between the top and bottom source/drain regions.

Doping can be performed using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), boron fluoride ($BF_2$), gallium (Ga), indium (In), and thallium (Tl) at various concentrations. For example, in a non-limiting example, a dopant concentration range may be $1e18/cm^3$ to $1e21/cm^3$.

Top spacers 155 are formed on gate structures 130' and 130" to isolate the gate structures 130' and 130" from the top source/drain regions 210, 212. Top spacers 155 include, but are not necessarily limited to, PECVD-type, high aspect ratio process (HARP)-type or high density plasma (HDP)-type low-K dielectric layers, including, but not limited to, SiBCN, SiOCN, SiN or $SiO_2$, deposited using, for example, PECVD, HARP or HDP techniques, on the gate structures 130' and 130".

A dielectric material, including, but not necessarily limited to, silicon oxide, silicon nitride, silicon oxynitride, SiCO, SiBCN, SiOCN, fluorine doped oxide, or some other dielectric, or any suitable combination of those materials, is deposited in vacant areas on the top spacers 155, and on the substrate 102 in areas 140, 141 and 142 to form inter-level dielectric (ILD) layer 150. The ILD layer 150 can be deposited using deposition techniques including, but not limited to, CVD, PECVD, radio-frequency CVD (RFCVD), PVD, ALD, molecular layer deposition (MLD), molecular beam deposition (MBD), pulsed laser deposition (PLD), and/or liquid source misted chemical deposition (LSMCD), sputtering, and/or spin-on. Planarization, for example, CMP can be performed to remove excess material from ILD layer 150 and planarize the resulting structure.

Figure 8A:
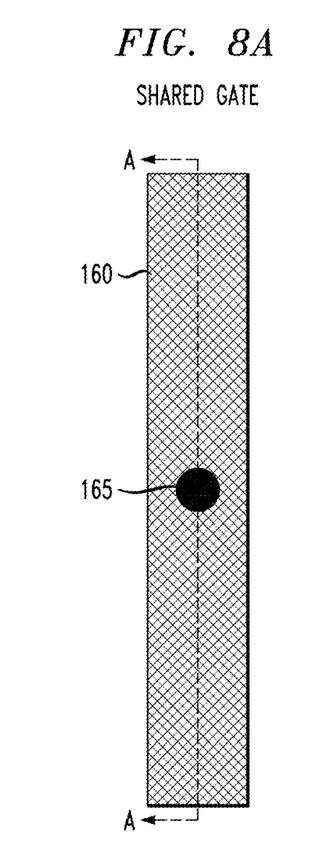
FIGS. 8A-8B are top-down views and FIGS. 8C-8D are cross-sectional views of additional inter-level dielectric deposition and contact formation in a method of manufacturing a semiconductor device, according to an exemplary embodiment of the present invention.
Figure 8B:
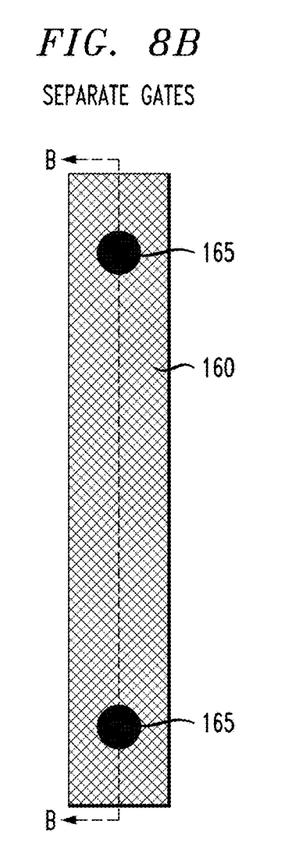
Figure 8C:
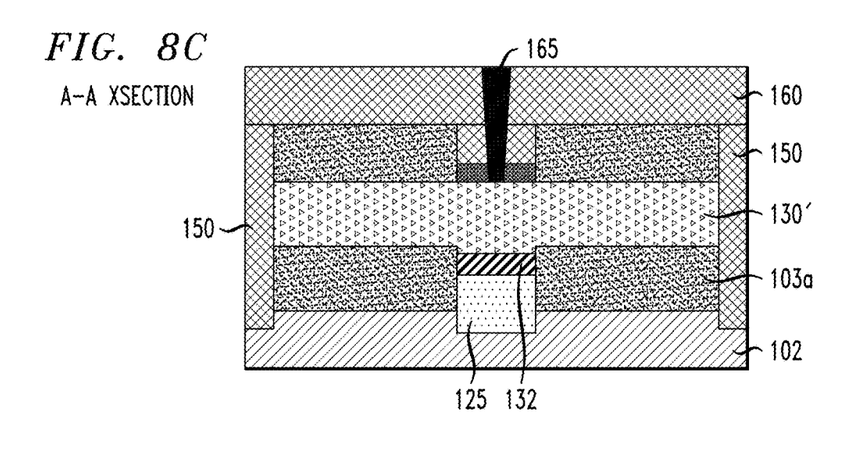
Figure 8D:
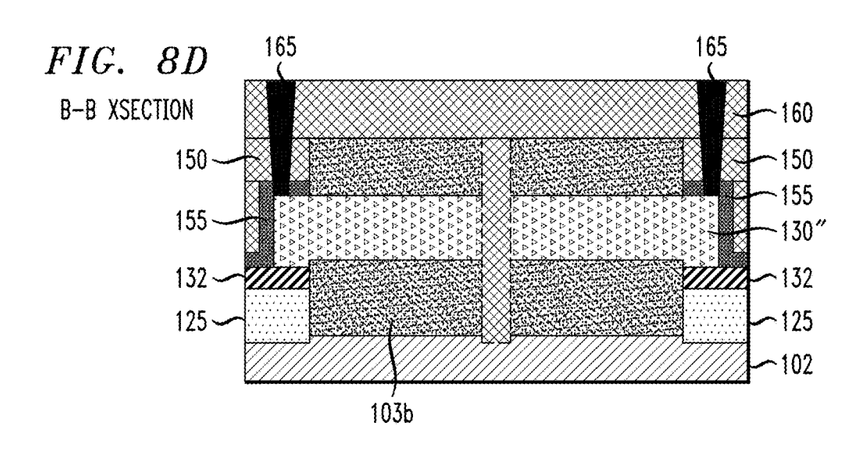

FIGS. 8A-8B are top-down views and FIGS. 8C-8D are cross-sectional views of additional inter-level dielectric deposition and contact formation in a method of manufacturing a semiconductor device, according to an exemplary embodiment of the present invention. Referring to FIGS. 8A-8D, additional dielectric material, including, but not necessarily limited to, silicon oxide, silicon nitride, silicon oxynitride, SiCO, SiBCN, SiOCN, fluorine doped oxide, or some other dielectric, or any suitable combination of those materials, is deposited on ILD layer 150 to form another ILD layer 160. The ILD layer 150 can be deposited using the same deposition techniques as used to deposit ILD layer 150, and planarization, for example, CMP can be performed to remove excess material from ILD layer 160 and planarize the resulting structure. The ILD layer 160 can include the same or a different material from ILD layer 150. As an alternative to performing an additional step to deposit ILD layer 160, ILD layer 150 can be planarized to a level corresponding to the top surface of ILD layer 160, without depositing ILD layer 160.

Referring to FIGS. 8A-8D, contact regions 165 to gate structures 130' and 130" are formed by etching vias in the ILD layers 150 and 160 and through top spacer layers 155, and filling the vias with an electrically conductive material. For example, contact regions 165 can include a conductive metal such as, but not necessarily limited to, tungsten, cobalt, ruthenium, copper, or combinations thereof. The contacts may further comprise a conductive liner on the sidewalls of contact trenches. The conductive liner can include, but is not necessarily limited to, tantalum nitride, titanium nitride, ruthenium, or ruthenium oxide. The conductive metal may be deposited using, for example, deposition techniques including, but not limited to, CVD, PECVD, RFCVD, PVD, ALD, MLD, MBD, pulsed laser deposition, and/or LSMCD, sputtering, and/or plating. Planarization, for example, CMP can be performed to remove excess contact material after deposition and planarize the resulting structure. Although not shown, contacts to source/drain regions 103a, 103b, 210, 212 can be formed using similar processing and materials to that used in connection with contacts 165.

Figure 9A:
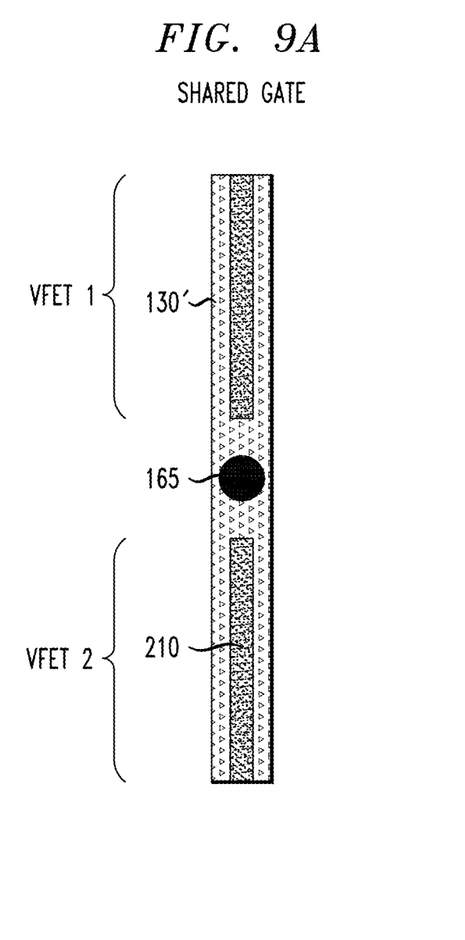
FIGS. 9A-9B are simplified top-down views showing shared and separate gate configurations, according to an exemplary embodiment of the present invention.
Figure 9B:
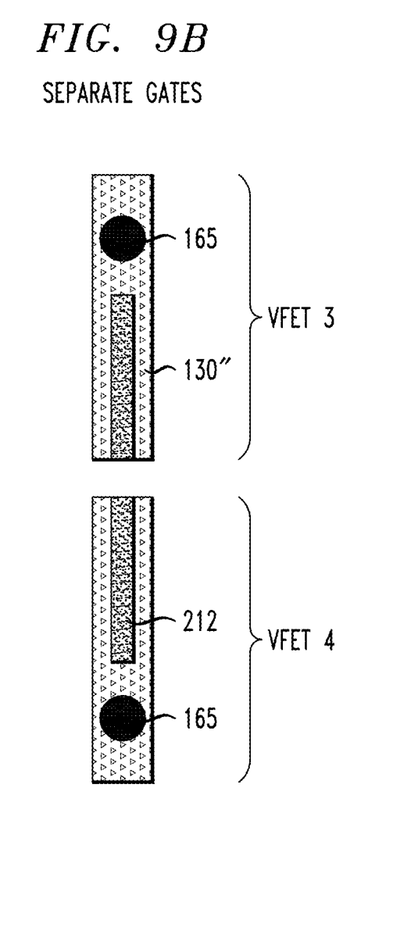

FIGS. 9A-9B are simplified top-down views showing shared and separate gate configurations, according to an exemplary embodiment of the present invention. As can be understood from the simplified top-down views, FIG. 9A (and FIG. 8C) illustrates a shared gate configuration, where a gate 130' is shared by two VFETs, VFET 1 and VFET 2, as illustrated by single gate contact 165 between VFETs 1 and 2. The simultaneous gate and fin cutting described herein was performed at top and bottom edges in FIG. 9A (left and right edges in FIG. 8C), and fin 110 was cut at a central portion prior to gate deposition. FIG. 9B (and FIG. 8D) illustrates a separate gate configuration, where a gate 130" is separated into portions respectively corresponding to VFET 3 and VFET 4, as illustrated by gate contacts 165 at upper and lower portions of FIG. 9B (and left and right portions in FIG. 8D). The simultaneous gate and fin cutting described herein was performed at the central portion in FIG. 9B, and fin 112 was cut at top and bottom edges in FIG. 9B (left and right edges in FIG. 8D) prior to gate deposition.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
    at least two vertical transistors positioned adjacent each other on a substrate, wherein the at least two vertical transistors each comprise:
        a fin comprising a bottom source/drain region and a top source/drain region;
        a gate structure formed around the fin; and
        a dielectric layer formed on a portion of the gate structure, wherein the dielectric layer wraps around the gate structure from a top surface to a side surface of the gate structure and contacts a portion of the top source/drain region;
    wherein a first edge of a first vertical transistor of the at least two vertical transistors is positioned opposite a second edge of a second vertical transistor of the at least two vertical transistors;
    wherein the fins and gate structures of each of the at least two vertical transistors are aligned in the vertical direction with respect to the substrate at the first and second edges, respectively; and
    wherein edges of the gate structures of each of the at least two vertical transistors and edges of the bottom and top source/drain regions of each fin are aligned in the vertical direction with respect to the substrate at the first and second edges, respectively.

2. The semiconductor device according to claim 1, wherein each fin comprises a channel region between the top and bottom source/drain regions.

3. The semiconductor device according to claim 1, further comprising an additional dielectric layer between the first and second edges.

4. The semiconductor device according to claim 3, wherein a top surface of the additional dielectric layer is coplanar with the top source/drain regions of each fin.

5. The semiconductor device according to claim 1, wherein the gate structures of the first and second vertical transistors are electrically isolated from each other.

6. The semiconductor device according to claim 5, further comprising contacts respectively formed on the gate structures of each of the at least two vertical transistors.

7. The semiconductor device according to claim 1, wherein at least one of the first and second vertical transistors shares its gate structure with a third vertical transistor.

8. The semiconductor device according to claim 1, wherein the third vertical transistor is adjacent one of the first and second vertical transistors.

9. The semiconductor device according to claim 1, further comprising contacts respectively formed on the gate structures of each of the at least two vertical transistors, wherein the contacts contact the gate structures through respective openings in the dielectric layers of each of the at least two vertical transistors.

* * * * *